(12) United States Patent
Broughton et al.

(10) Patent No.: US 9,426,844 B2
(45) Date of Patent: Aug. 23, 2016

(54) ELECTRICAL RAFT WITH MAP

(71) Applicant: ROLLS-ROYCE PLC, London (GB)

(72) Inventors: Paul Broughton, Leicester (GB); Richard Peace, Derby (GB); Gary Alan Skinner, Nottingham (GB); Robin Charles Kennea, Nottingham (GB); Michael Christopher Willmot, Sheffield (GB); Philip Summerfield, Derby (GB)

(73) Assignee: ROLLS-ROYCE PLC, London (GB)

( * ) Notice: Subject to any disclaimer, the term of this patent is extended or adjusted under 35 U.S.C. 154(b) by 947 days.

(21) Appl. No.: 13/716,516

(22) Filed: Dec. 17, 2012

(65) Prior Publication Data
US 2013/0298566 A1  Nov. 14, 2013

(30) Foreign Application Priority Data

Dec. 22, 2011  (GB) .................................. 1122140.5
Dec. 22, 2011  (GB) .................................. 1122143.9
Mar. 7, 2012   (GB) .................................. 1203991.3

(51) Int. Cl.
*H05B 3/28* (2006.01)
*F02C 7/12* (2006.01)
(Continued)

(52) U.S. Cl.
CPC ................. *H05B 3/28* (2013.01); *B23P 6/005* (2013.01); *B60R 16/00* (2013.01); *B60R 16/02* (2013.01); *B60R 16/0207* (2013.01);
(Continued)

(58) Field of Classification Search
CPC .......... F05D 2260/30; F05D 2240/90; F05D 2240/91; F05D 2260/02; B64D 29/08; F02C 7/32; H01R 12/00; H01R 12/51; H02G 1/00; H02G 3/02; H02G 3/04; H02G 3/00; H05B 3/28; B60R 16/00; B60R 16/02; B60R 16/0207; B60R 16/08
See application file for complete search history.

(56) References Cited

U.S. PATENT DOCUMENTS 2,523,083 A  9/1950 Witkowski
2,523,504 A  9/1950 Ford, Jr.
(Continued)

FOREIGN PATENT DOCUMENTS

DE  2941950 B1  2/1981
EP  1741879 A1  1/2007
(Continued)

OTHER PUBLICATIONS

Apr. 20, 2012 Search Report issued in British Patent Application No. GB1122140.5.
(Continued)

*Primary Examiner* — Phutthiwat Wongwian
*Assistant Examiner* — William Breazeal
(74) *Attorney, Agent, or Firm* — Oliff PLC (57) ABSTRACT

An electrical raft 200 is provided that has electrical conductors 252 embedded in a rigid material 220. The electrical raft 200 may have other embedded components, such as embedded fluid pipes 210. The electrical raft 200 is provided with a raft map 400 that indicates the location and/or path of components embedded in the electrical raft 200. The raft map 400 can be used to identify the positions of the embedded components, and may also be provided with active elements, such as LEDs, which may be used to indicate an operating state of the systems/components embedded in the electrical raft 200. The raft map 400 may be useful in assembly, repair and fault diagnosis, for example.

14 Claims, 6 Drawing Sheets

(51) Int. Cl.
| | |
|---|---|
| *F02C 7/20* | (2006.01) |
| *B23P 6/00* | (2006.01) |
| *H02G 3/04* | (2006.01) |
| *H01R 12/00* | (2006.01) |
| *H02G 3/32* | (2006.01) |
| *B60R 16/02* | (2006.01) |
| *B64C 3/34* | (2006.01) |
| *F02C 7/141* | (2006.01) |
| *H01R 12/57* | (2011.01) |
| *H01R 12/59* | (2011.01) |
| *H01R 12/51* | (2011.01) |
| *H01R 12/61* | (2011.01) |
| *H02G 3/00* | (2006.01) |
| *B60R 16/08* | (2006.01) |
| *F02C 7/16* | (2006.01) |
| *B60R 16/00* | (2006.01) |
| *B64D 29/08* | (2006.01) |
| *F02C 7/00* | (2006.01) |
| *F02C 7/32* | (2006.01) |
| *H02G 1/00* | (2006.01) |
| *H02G 3/02* | (2006.01) |
| *F02C 7/047* | (2006.01) |
| *F02C 7/224* | (2006.01) |
| *F24H 1/10* | (2006.01) |
| *H05B 1/02* | (2006.01) |

(52) U.S. Cl.
CPC .......... *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(56) References Cited

U.S. PATENT DOCUMENTS

| | | | |
|---|---|---|---|
| 2,877,544 A * | 3/1959 | Gammel | 29/833 |
| 3,128,214 A | 4/1964 | Lay | |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 4,137,888 A | 2/1979 | Allan | |
| 4,149,567 A | 4/1979 | Weirich | |
| 4,220,912 A * | 9/1980 | Williams | 324/503 |
| 4,488,970 A * | 12/1984 | Clark | B01D 17/0214 210/114 |
| 4,671,593 A | 6/1987 | Millon-Fremillon et al. | |
| 5,004,639 A | 4/1991 | Desai | |
| 5,031,396 A | 7/1991 | Margnelli | |
| 5,091,605 A | 2/1992 | Clifford | |
| 5,138,784 A * | 8/1992 | Niwa | G09F 3/04 40/316 |
| 5,142,448 A | 8/1992 | Kober et al. | |
| 5,174,110 A * | 12/1992 | Duesler | F02C 7/32 138/111 |
| 5,249,417 A | 10/1993 | Duesler et al. | |
| 5,435,124 A | 7/1995 | Sadil et al. | |
| 5,688,145 A | 11/1997 | Liu | |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,157,542 A | 12/2000 | Wu | |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 | 3/2004 | Kondo | |
| 6,969,807 B1 | 11/2005 | Lin et al. | |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 | 6/2009 | Derenes et al. | |
| 7,661,272 B2 | 2/2010 | Gagneux et al. | |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,581,103 B2 | 11/2013 | Aspas Puertolas | |
| 8,794,584 B2 | 8/2014 | Shimada et al. | |
| 8,937,254 B2 | 1/2015 | Wen et al. | |
| 9,010,716 B2 | 4/2015 | Kobori | |
| 9,040,821 B2 | 5/2015 | Blanchard et al. | |
| 2002/0009361 A1 * | 1/2002 | Reichert | F01D 11/22 415/110 |
| 2002/0086586 A1 | 7/2002 | Shi et al. | |
| 2002/0170729 A1 | 11/2002 | Murakami et al. | |
| 2003/0095389 A1 | 5/2003 | Samant et al. | |
| 2003/0155467 A1 | 8/2003 | Petrenko | |
| 2004/0065092 A1 | 4/2004 | Wadia et al. | |
| 2004/0266266 A1 | 12/2004 | Lai | |
| 2004/0266274 A1 | 12/2004 | Naudet et al. | |
| 2006/0272340 A1 | 12/2006 | Petrenko | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2007/0254536 A1 * | 11/2007 | Vagt | B60T 8/3675 439/835 |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 | 10/2008 | Prellwitz et al. | |
| 2009/0189051 A1 | 7/2009 | Love | |
| 2009/0230650 A1 | 9/2009 | Mayen et al. | |
| 2009/0242703 A1 | 10/2009 | Alexander et al. | |
| 2009/0277578 A1 | 11/2009 | Sung et al. | |
| 2009/0289232 A1 | 11/2009 | Rice | |
| 2010/0162726 A1 | 7/2010 | Robertson et al. | |
| 2010/0261365 A1 | 10/2010 | Sakakura | |
| 2010/0308169 A1 | 12/2010 | Blanchard et al. | |
| 2011/0011627 A1 | 1/2011 | Aspas Puertolas | |
| 2011/0016882 A1 | 1/2011 | Woelke et al. | |
| 2011/0017879 A1 | 1/2011 | Woelke et al. | |
| 2011/0053468 A1 | 3/2011 | Vontell | |

(56) References Cited

U.S. PATENT DOCUMENTS

| | | | |
|---|---|---|---|
| 2011/0111616 | A1 | 5/2011 | Chang et al. |
| 2011/0120748 | A1 | 5/2011 | Bailey |
| 2011/0315830 | A1 | 12/2011 | Eshima et al. |
| 2012/0012710 | A1 | 1/2012 | Yamaguchi et al. |
| 2012/0018240 | A1* | 1/2012 | Grubaugh ............... B60T 7/14 180/273 |
| 2012/0103685 | A1* | 5/2012 | Blanchard et al. ......... 174/72 A |
| 2012/0111614 | A1 | 5/2012 | Free |
| 2012/0149232 | A1 | 6/2012 | Balzano |
| 2012/0267239 | A1* | 10/2012 | Chen ..................... H01L 23/473 204/242 |
| 2012/0312022 | A1 | 12/2012 | Lam et al. |
| 2013/0189868 | A1 | 7/2013 | Fitt et al. |
| 2013/0316147 | A1 | 11/2013 | Douglas et al. |

FOREIGN PATENT DOCUMENTS

| | | |
|---|---|---|
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,497, filed Dec. 17, 2012.
Nov. 10, 2014 Office Action issued in U.S. Appl. No. 13/716,300.
Nov. 20, 2014 Office Action issued in U.S. Appl. No. 13/716,648.
Fitt et al., Pending U.S. Appl. No. 13/792,851, filed Mar. 11, 2013.
Feb. 25, 2015 Office Action issued in U.S. Appl. No. 13/716,497.
Mar. 11, 2015 Office Action issued in U.S. Appl. No. 13/716,300.
Apr. 6, 2015 Office Action issued in U.S. Appl. No. 13/716,648.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Aug. 15, 2014 Office Action issued in U.S. Appl. No. 13/716,497.
Sep. 4, 2015 Office Action issued in U.S. Appl. No. 13/716,503.
Jun. 5, 2015 Office Action issued in U.S. Appl. No. 13/716,708.
Jun. 12, 2015 Office Action issued in U.S. Appl. No. 13/716,254.
Nellis and Klein, "Heat Transfer", 2009, Campridge University, pp. 748-751.
Jun. 19, 2015 Office Action issued in U.S. Appl. No. 13/716,244.
Jul. 29, 2015 Office Action issued in U.S. Appl. No. 13/716,648.
Jul. 17, 2015 Office Action issued in U.S. Appl. No. 13/716,497.
Jul. 28, 2015 Office Action issued in U.S. Appl. No. 13/716,796.
Aug. 14, 2015 Office Action issued in U.S. Appl. No. 13/716,239.
Aug. 27, 2015 Office Action issued in U.S. Appl. No. 13/792,851.

* cited by examiner

ELECTRICAL RAFT WITH MAP

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, and British Patent Application Number 1203991.3 filed 7 Mar. 2012, the entire contents of all of which are incorporated by reference.

BACKGROUND OF THE INVENTION

1. Field of the Invention

The invention relates to an electrical system, in particular an electrical system for a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

Figure 1:
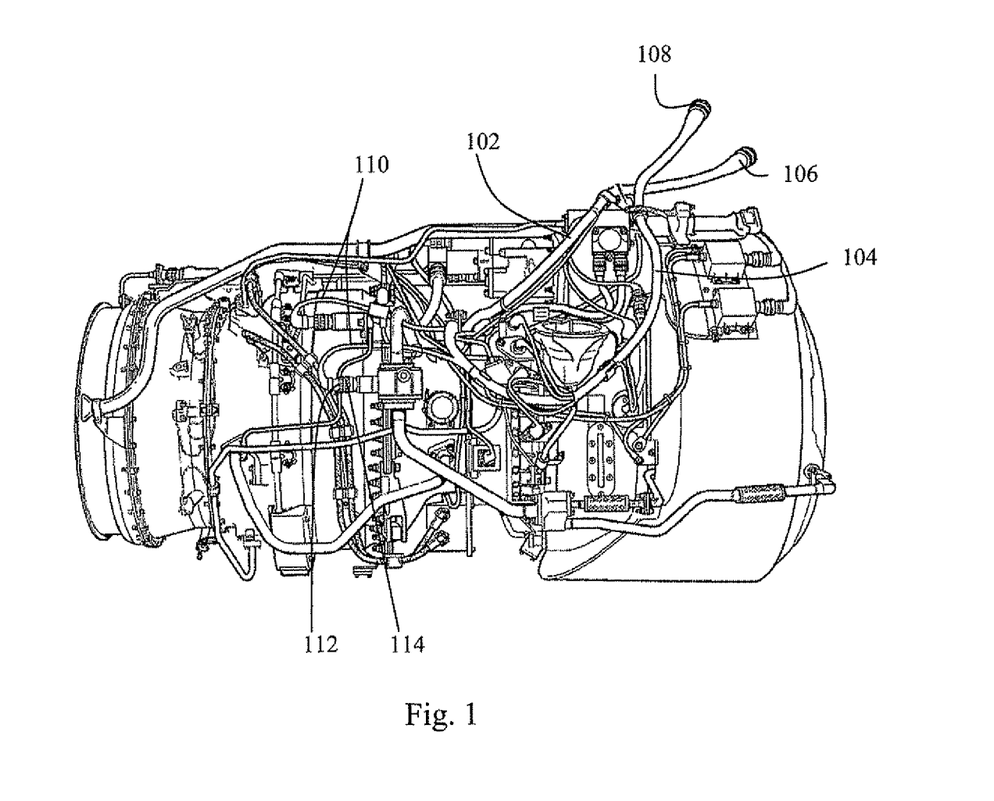
FIG. 1 shows a gas turbine engine with a conventional harness.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY OF THE INVENTION

It is advantageous to be able to easily identify, track and locate conductors in the electrical harness, and other electrical components of the electrical system. This may assist in fault diagnosis and/or in assembly of the electrical system on an engine. The ability to identify, track and locate conductors/components in a conventional harness is limited. It may, for example, be possible (if difficult) to locate the start/end of a conductor, or to locate a connector to which a conductor is connected, but it is difficult and/or time consuming to manually track that conductor through the harness.

An object of the invention is to address at least one of the drawbacks associated with conventional harnesses, whilst improving the ability to identify electrical components and other electrical components of an electrical system.

According to an aspect of the invention, there is provided an electrical raft comprising components embedded in a rigid material, the components including electrical components that form at least a part of an electrical system. The electrical raft also comprises a raft map that indicates (or shows) the position of at least some of the embedded electrical components within the raft. The raft map is visible from outside the electrical raft.

The electrical system may comprise electrical conductors embedded in the rigid material. As described herein, such electrical conductors may be in the form of electrical wires, which may be sheathed. The electrical conductors may be embedded in a flexible material, and thus may be a part of a flexible printed circuit board (or FPCB). The raft map may show the position and/or path of the embedded conductors within the raft. For example, the raft map may comprise lines that show the position of the conductors embedded in the raft.

An electrical raft according to the invention may be used in an engine, such as a gas turbine engine. For example, an electrical raft (which may be referred to as an electrical raft assembly) may be used as a part of an electrical harness or electrical loom of a gas turbine engine, and thus may be referred to as an electrical harness raft. Thus, at least a part (for example all) of a conventional electrical harness of a gas turbine engine may be replaced with one or more electrical rafts, at least one of which may have a raft map indicating the position of embedded components. As such, the components/systems embedded in the raft may be gas turbine engine components/systems, or parts thereof.

Thus, there is provided a gas turbine engine or gas turbine engine installation (for example for an airframe) comprising an electrical raft and/or an electrical raft assembly as described above and elsewhere herein.

Use of one or more electrical rafts may significantly reduce build time of an engine. For example, use of electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Thus, use of electrical rafts in a gas turbine installation may reduce assembly time and/or reduce the possibility of errors occurring during assembly.

Use of electrical rafts may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. The electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Use of a raft map, which may be referred to as a mimic map, allows the positions of embedded components that would otherwise not be visible from outside the raft to be identified. This can help to identify the components (such as electrical circuits) circuits contained within a raft, and where they are located within that raft. This may have various advantages, for example in deciding mounting locations for mounting the raft to another component and/or for mounting other components to the raft. It may also be useful during maintenance/repair in understanding which circuits/components may be damaged, and how that damage may relate to the position within the raft.

The raft map may be used to show the position of any component embedded within the raft. An electrical raft (or electrical raft assembly) may comprise a fluid passage. Such a fluid passage may be embedded therein and/or otherwise provided thereto. The fluid passage may be part of a fluid system, such as a gas (for example pneumatic or cooling gas/air) and/or liquid (for example a fuel, hydraulic and/or lubricant liquid). In embodiments including an embedded fluid passage, the raft map may indicate the location/position/path of the embedded fluid passages. The raft map may also indicate the direction in which fluid is configured to flow through the fluid passage in use.

Knowing the position/location (and optionally the shape/fluid flow direction) of any embedded fluid passages may provide advantages in, for example, understanding the likely position and/or reason(s) for any damage and/or blockage in an embedded fluid passage.

The raft map may thus indicate passive information about components embedded within the raft, that is information that does not change, such as location/position/shape of embedded components. Optionally, the raft map may comprise active information, that is information that may change during use. Such information may be used, for example, to monitor the state of the raft, for example during testing and/or use.

Thus, the raft map may comprise an active indicator indicating the state of an embedded component or system. The active indicator may have at least two outputs, with each output indicating a different state of the embedded component or system. The at least two outputs may be a part of a sliding scale of outputs.

For example, an active indicator may indicate the state of an embedded electrical component or system. The state indicated by the active indictor may correspond to a voltage across and/or a current through an electrical component in use.

In examples having embedded fluid passages, the active indicator may indicate different states of the fluid passage in use. For example, the state indicated by the active indicator may correspond to a flow rate and/or a flow pressure through the fluid passage in use.

It will be appreciated that an active indicator may thus be used for diagnosing faults, detecting damage and/or checking performance of an embedded component or system.

Such an active indicator may, for example, comprise a light emitting device, such a light emitting diode (LED).

The raft map may show a topological representation of at least some of the components embedded in the rigid material. Thus, the raft map may show a simplified version of the embedded systems/components. Such a simplified raft map may, for example, show a schematic of the embedded components, rather than the precise shape/location of embedded components.

Alternatively, the raft map may be an accurate representation of the location, position and shape of the embedded components (although it will be appreciated that simplified, for example well-known, symbols may be used to represent certain embedded components). Such an accurate representation may be referred to as a geographical representation of the components embedded in the rigid material.

Accordingly, the raft map may show a projection of the actual position of at least some of the embedded components. The projection may be onto a major surface of the raft. In this regard, the raft may be a substantially thin body, with the major surface(s) being perpendicular to the thickness direction. Such a major surface may thus be substantially parallel to, and offset from, the embedded components. In this arrangement, the projection may be a projection onto a major surface of the electrical raft. Such a major surface may be visible during use, for example when the raft map is installed in a gas turbine engine.

The raft map may be a full scale (or substantially full scale) representation of the embedded components. Thus, a user looking at such a raft map may be able to immediately determine the embedded components/systems that lie underneath/below the raft map.

Any suitable material may be used for the rigid material of the electrical raft. For example, the rigid material may be a rigid composite material, such as an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve.

As mentioned elsewhere herein, at least some (for example a plurality) of the electrical conductors may be provided in a flexible printed circuit (FPC). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein. Any one or more of these embedded electrical wires/conductors may be shown on the raft map.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

According to an aspect, there is provided a method of assembling an electrical raft assembly and/or a gas turbine engine. The method comprises preparing an electrical raft assembly as described above and elsewhere herein. The method also comprises electrically and mechanically connecting the prepared electrical raft assembly to the rest of the apparatus/gas turbine engine.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft. The raft map may provide an effective means of readily identifying the location and/or path of the electrical conductors that are connected to the electrical connectors.

There is also provided a method of servicing a gas turbine engine comprising an electrical raft as described herein. The method comprises removing the electrical raft from a gas turbine engine; and installing a second, pre-prepared, electrical raft onto the gas turbine engine in place of the removed electrical raft. The second, pre-prepared electrical raft may be of the same, or a modified specification as the removed electrical raft.

The removed electrical raft may, for example, be tested and/or repaired (if necessary) once removed from the gas turbine engine. The removed and optionally tested and/or repaired electrical raft may then be used as the replacement (or second) raft during another service, which may be of the same or a different engine.

The raft map may assist during such a service arrangement, for example in understanding how best to remove the first raft and/or install the second raft, and/or in the testing of the removed raft, including diagnosis of any problems.

According to an aspect, there is provided a gas turbine engine comprising an electrical raft as described herein. The electrical raft may form a first engine installation component. The gas turbine engine may comprise a second engine installation component comprising electrical conductors. At least one flexible cable may be electrically connected between the electrical raft (or first engine installation component) and the second engine installation component. Thus, the flexible cable(s) may electrically connect electrical conductors of the electrical raft with electrical conductors of the second engine installation component.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. The type of electrical signal being transmitted by a given conductor may be shown (for example written) on the raft map. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

An electrical raft or raft assembly may be provided in any suitable location/position of the gas turbine engine, for example to a mounting structure at any suitable location. For example, the gas turbine engine may comprise a bypass flow duct formed between an engine core and an engine fan casing (the gas turbine engine may be a turbofan engine, for example); and the electrical raft assembly may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core. By way of further example, the electrical raft assembly may be attached to the engine core case or engine fan case, for example to a mounting structure on such cases.

Other components/systems of a gas turbine engine may be provided to an electrical raft in any suitable manner. For example, such other components/systems may be mounted on one or more electrical raft assemblies. Thus, a surface of an electrical harness raft may be used as a mounting surface for other gas turbine engine components/systems, such as ancillary/auxiliary components/systems.

For example, an electrical unit may be mounted on an electrical raft. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft. Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein.

The raft map may be particularly useful in providing a means for understanding how components/systems mounted on a raft interact with the components embedded within the raft.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. More than one set of fluid pipes, for example for carrying different or the same fluids, may be mounted on the same electrical raft. In some cases, fluid pipes mounted on a raft may be fluidly connected to fluid pipes embedded within the raft. Again, in such an arrangement the raft map may help to understand the construction of the entire fluid system, including both embedded and mounted components.

An anti-vibration mount may be used to attach an electrical raft to another component, thereby allowing the electrical raft to be vibration isolated (or at least substantially vibration isolated). Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 2:
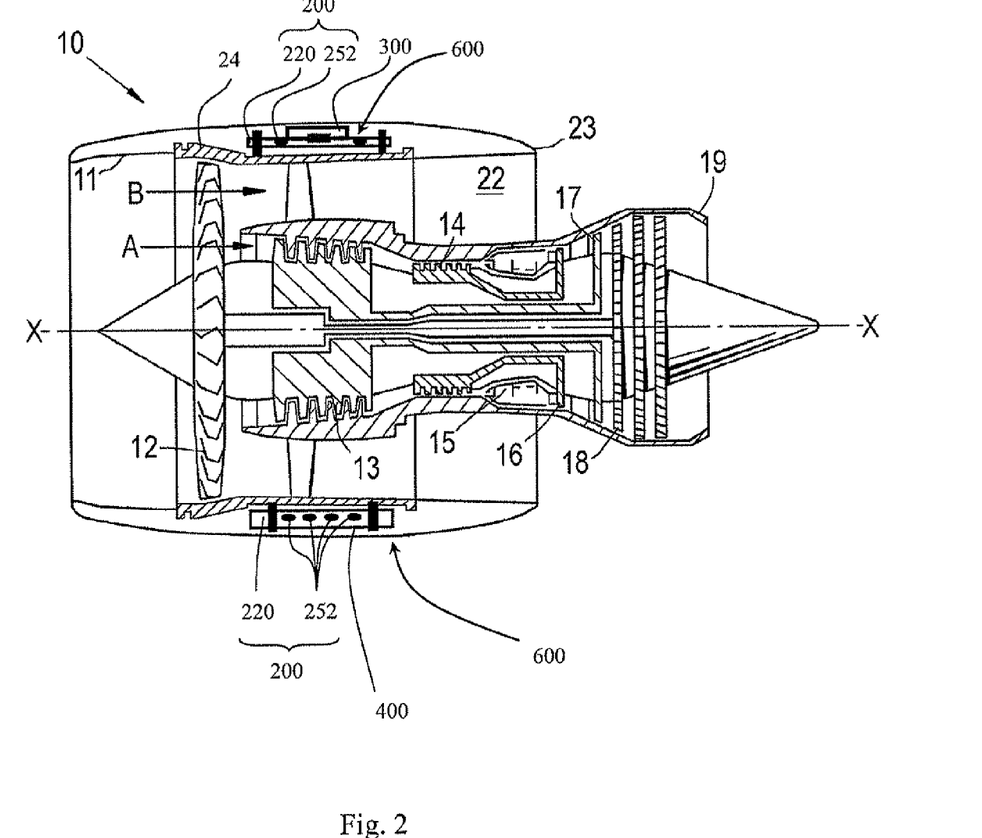
FIG. 2 shows a cross-section through a gas turbine engine having an electrical raft in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical rafts 200 according to the present invention as part of electrical raft assemblies 600. As such, the gas turbine engine 10 is in accordance with the present invention. Each electrical raft assembly 600 comprises an electrical raft 200. The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material. The electrical raft 200 shown in FIG. 2 also comprises a raft map 400, which indicates the position of components embedded in the electrical raft 200. The raft map 400 is described in greater detail below in relation to FIGS. 3 and 4 in particular.

Figure 3:
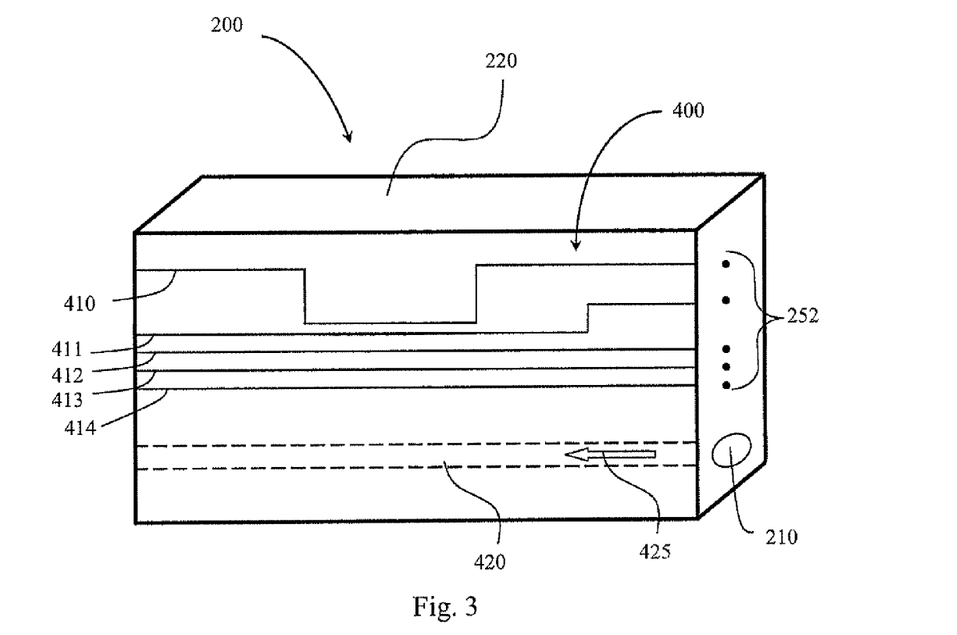
FIG. 3 shows a perspective view of a segment of an electrical raft having a raft map according to an aspect of the invention.

FIG. 3 shows a perspective view of a portion of an electrical raft 200. The electrical raft 200 comprises electrical conductors 252 and a fluid passage (which may be a fluid pipe) 210 embedded in a rigid material 220. On an upper surface of the electrical raft 200 there is provided a raft map 400. The raft map 400 indicates the location of the embedded electrical conductors 252 and fluid passage 210.

The raft map 400 in the example shown in FIG. 3 comprises five lines 410-414, each of which corresponds to a respective embedded electrical conductor 252. The five lines 410-414, which are visible from outside the electrical raft 200 indicated the paths of the electrical conductors 252 within the electrical raft 200. In the absence of the lines 410-414, the path/location of the electrical conductors 252 within the electrical raft 200 would be difficult, or impossible, to identify from the outside.

The raft map 400 shown in FIG. 3 also comprises a lane 420 in the form of two dashed lines. The lane 420 indicates the path of the embedded fluid passage 410 in the electrical raft 200. Again, without the lane 420, the path/location of the fluid passage 410 within the electrical raft 200 would be difficult, or impossible, to identify from the outside. The raft map 400 of FIG. 3 also includes an arrow 425 that indicates the direction of the flow through the fluid passage 410 in use.

Other data may also be provided by the raft map 400. For example, although not shown in FIG. 3, the raft map 400 could indicate the type of fluid flowing through the fluid passage 210 and/or the type of signal being carried by the conductors 252. Such indications could take any suitable form, such as wording, symbols, or colour coding.

Figure 4:
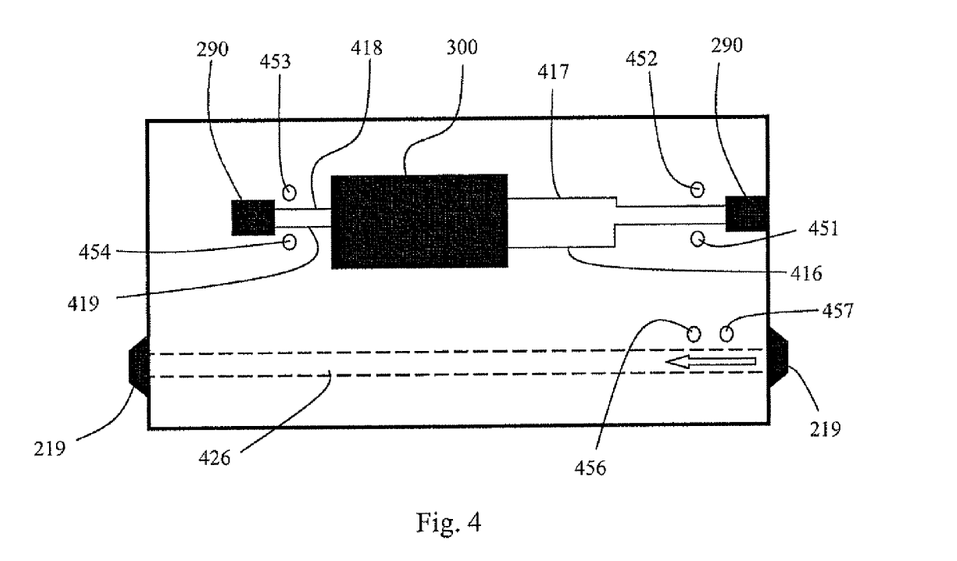
FIG. 4 shows an overhead view of an electrical raft having a raft map according to an aspect of the invention.

FIG. 4 shows a top view of an electrical raft 200 according to an example of the invention, i.e. a view looking down onto a major surface of the electrical raft 220. The major surface may be defined as a surface that is perpendicular to the through-thickness direction of the electrical raft 200. A raft map 400 is provided on the major surface of the electrical raft 200.

The electrical raft 200 shown in FIG. 4 has electrical conductors embedded therein, with their paths indicated by lines 416-419 on the raft map 400. The electrical raft 200 shown in FIG. 4 also has an electrical unit 300 (which may be, for example, an ECU such as an EMU or an EEC) mounted thereon, i.e. mechanically and electrically connected on the surface of the electrical raft 200.

The embedded electrical conductors indicated by the lines 416, 417 electrically connect the electrical unit 300 (or at least a connector to which the electrical unit 300 is connected) to an electrical connector 290 provided on one side of the electrical raft 200. The electrical connector 290 could then be connected to another component, for example either directly or via a flexible cable. The embedded electrical conductors indicated by the lines 418, 419 electrically connect the electrical unit 300 (or at least a connector to which the electrical unit 300 is connected) to another electrical connector 290 provided on the surface of the electrical raft 200. Again, the electrical connector 290 could then be connected to another component, for example either directly or via a flexible cable.

The electrical raft 200 of FIG. 4 also has a fluid passage embedded therein, as indicated by the dashed lane 426. As shown by the dashed lane 426, the embedded fluid passage extends directly between two fluid connectors 219. The fluid connectors 219 could be used to connect the embedded fluid pipe to another part of the fluid system.

The lines 416-419 and the lane 426 may be examples of passive indicators. Such passive indicators may provide data relating to features of the embedded components that do not change, such as position or path.

However, the raft map 400 of an electrical raft 200 may also be provided with active indicators, that is indicators that provide data about a state of the embedded components/systems that may vary. The raft map 400 shown in FIG. 4, for example, has such active indicators in the form of LEDs 451-454, 456, 457.

Each of the LEDs 451-454 corresponds to a respective embedded conductor indicated by the lines 416-419. The LEDs 451-454 may, for example, be illuminated when a current (for example a current above a certain threshold) passes through the respective embedded conductor. This may be achieved in any suitable way, for example by electrically connecting each LED 451-454 to its respective embedded conductor. In this way, the LEDs can provide an indication of whether current is flowing through a given conductor. This may be beneficial, for example, in detecting faults.

The LEDs 456, 457 correspond to the embedded fluid passage indicated by the dashed lane 426 on the raft map 400. One of the LEDs 456 may be illuminated, for example, when flow passes through the embedded fluid passage, for example above a certain speed or flow rate. The other LED 457 may be illuminated when the pressure (static or total) is above a certain threshold level. This is an example of how the active indicators 456, 457 could be used to provide data about the flow in the embedded fluid passage. Again, this may be beneficial, for example, in detecting faults, such as leakages/blockages.

It will be appreciated that raft maps 400 according to the invention may take many different forms, and that the raft maps shown and described in relation to FIGS. 3 and 4 are only examples of such raft maps 400. For example, components other than electrical conductors and fluid passages may be embedded in an electrical raft 200, and these too may be shown in the respective raft map 400 for that electrical raft 200. Similarly, the arrangement and/or number of components embedded in the raft may vary between rafts 200, and this variation would be reflected in the respective raft map 400.

In the examples described in relation to FIGS. 3 and 4, the embedded electrical conductors are shown in the form of embedded wires. However, as mentioned above, the embedded electrical conductors could be in any suitable form, such as an FPCB. Electrical conductors in an FPCB may be shown as individual lines on the raft map 400, and/or the FPCB itself may be indicated on the raft map 400.

Figure 5:
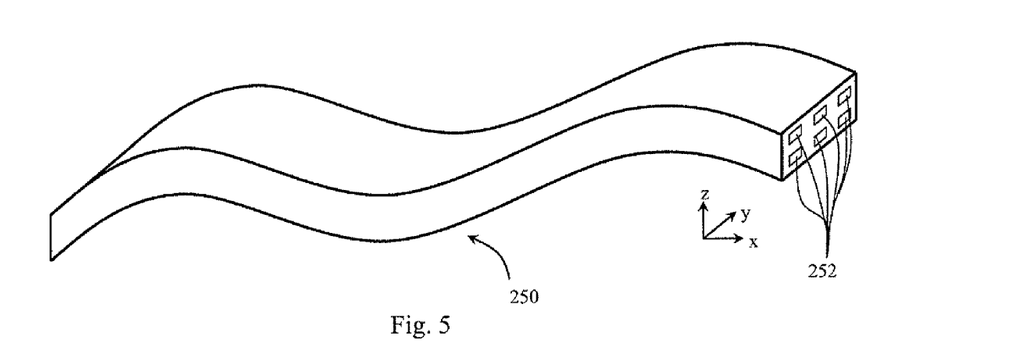
FIG. 5 shows a perspective view of a flexible printed circuit.
Figure 6:
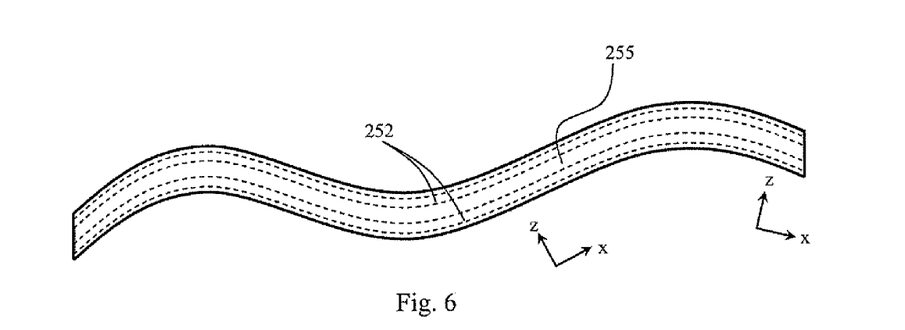
FIG. 6 shows a side view of the flexible printed circuit of FIG. 7.

An example of an FPC 250 in which the electrical conductors 252 may be provided is shown in greater detail in FIGS. 5 and 6. FIG. 5 shows a perspective view of the FPC 250, and FIG. 6 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 5 and 6, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 6. The x-y surface(s) (i.e. the surfaces formed by the x and y directions) may be said to be the major surface(s) of the FPC 250. In the example shown in FIGS. 5 and 6, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 5 and 6 has 6 conductive tracks 252 running through the substrate 255. However, the number of conductive tracks 252 running through a substrate 255 could be fewer than 6, or greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 5 and 6 comprises 2 layers of tracks, with each layer comprising 3 tracks 252. Where an FPCB comprises multiple layers of tracks, the raft map 400 may indicate the layer in which a given conductor is situated using a designated convention, such as (by way of example only) the lowest (or deepest) layer on the left hand side of the lines on the map.

An electrical raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 7:
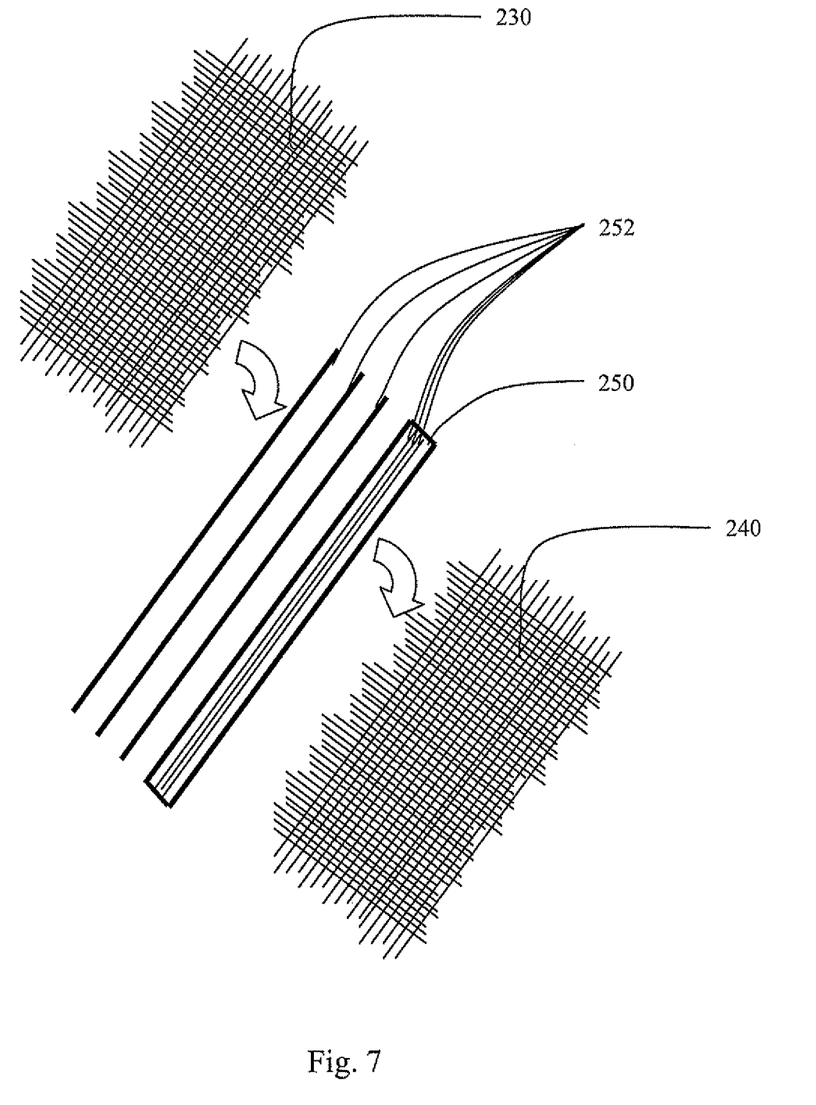
FIG. 7 shows a schematic of an electrical raft prior to assembly.

FIG. 7 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 7, the fibre and resin compound is formed of a sheet of interwoven fibres, or strands. The strands in FIG. 7 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. In some constructions no fibre may be used at all in the rigid material 220.

The raft map 400 may be provided to the raft 200 at any suitable time and in any suitable form. For example, the raft map 400 may be provided to the raft 200 after the raft has been cured around any embedded components. The raft map 400 may, for example, take the form of an etching into the surface of the electrical raft 200, or may be one or more sheets that are fixed to the desired surface of the electrical raft 200. Such sheets may be provided with a protective coating.

Figure 8:
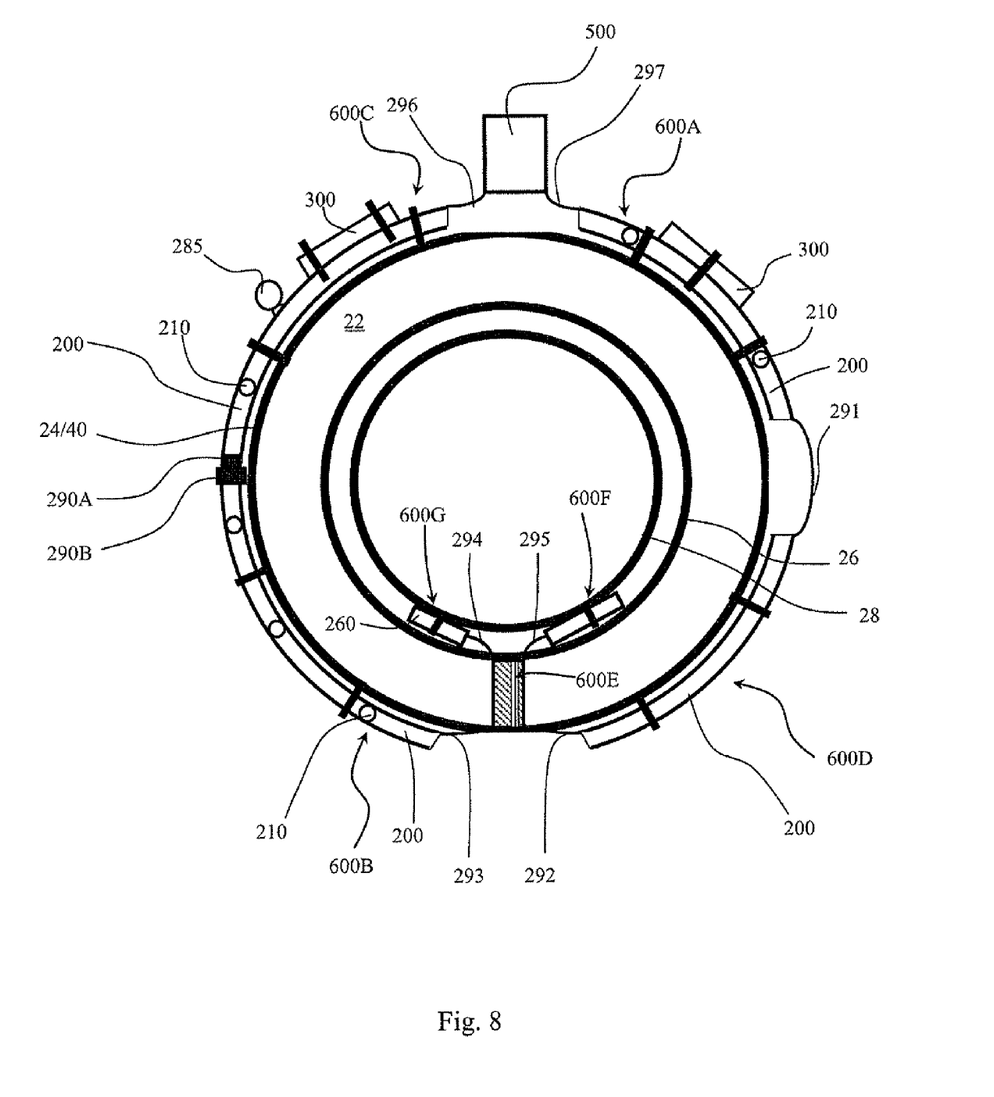
FIG. 8 shows a cross-section normal to the axial direction through a gas turbine engine according to an embodiment of the invention.

FIG. 8 is a schematic showing a cross-section perpendicular to the direction X-X of a gas turbine engine comprising electrical raft assemblies 600A-600G. Any one of the electrical raft assemblies 600A-600G may comprise an electrical raft 200 having an raft map 400, any optionally any or all of the features of an electrical raft assembly 200 as described elsewhere herein, for example. Thus, for example, any one of the electrical raft assemblies may comprise an electrical raft 200 (not labelled for raft assemblies 600E-600G for simplicity only) having electrical conductors 252 (not labelled in FIG. 8 for simplicity only) embedded therein. Any one of the electrical raft assemblies 600A-600G (which may collectively be referred to as electrical raft assemblies 600) may comprise a mounting fixture for attaching the respective assembly 600 to a mounting structure. The term electrical raft assembly 600 may be used to mean an electrical raft 200, together with any components mounted thereon or thereto. Thus, any description relating to an electrical raft assembly 600 may also relate to an electrical raft 200.

The mounting structure is part of a fan case 24 for electrical raft assemblies 600A-600D, part of a bifurcation splitter that radially crosses a bypass duct 22 for electrical raft assemblies 600E and part of an engine core case 28 for electrical raft assemblies 600F and 600G. However, it will be appreciated that an electrical raft assembly 600 could be mounted in any suitable and/or desired location on a gas turbine engine.

In FIG. 8, two electrical raft assemblies 600A, 600C are shown as having an electrical unit 300 mounted on the respective electrical raft 200. However, any (or none) of the electrical raft assemblies 600A-600G may have an electrical unit 300 mounted the respective electrical raft 200.

As mentioned herein, each of the electrical rafts 200 associated with the electrical raft assemblies 600A-600G shown in FIG. 8 comprises one or more electrical conductors 252 embedded therein, and at least one of the electrical rafts 200 also comprises a raft map 400. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

The arrangement of electrical raft assemblies 600A-600G shown in FIG. 8 is by way of example only. Alternative arrangements, for example in terms of number, size, shape and/or positioning, of electrical raft assemblies 600A-600G may be used. For example, there need not be 7 electrical raft assemblies, the assemblies may or may not be connected together, and the rafts could be provided to (for example mounted on) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-600G may have a fluid passage 210 embedded therein and/or provided thereto, which may be represented on a raft map 400, as described elsewhere herein. The fluid passage 210 may be part of a fluid system, such as a gas (for example pneumatic or cooling gas/air) and/or liquid (for example a fuel, hydraulic and/or lubricant liquid). In the FIG. 8 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 8. The fluid passages 210, 285 shown in FIG. 8 may be oriented in an axial direction of the engine 10. However, fluid passages may be oriented in any direction, for example axial, radial, circumferential or a combination thereof.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 8, and described below, but other connectors may be used. For example, electrical raft assemblies 600 (and/or non-electrical rafts) may be connected together (or to other components) using any combination of electrical, fluid and/or mechanical connectors. Thus, any of the electrical connections 290A/290B, 291-297 shown in FIG. 8 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 5 and 6. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 8, other electrical and/or fluid connections 292, 293, 294, 295 may be provided between electrical rafts 200 (or assemblies 600) and other components, such as other electrical rafts 200 (or assemblies 600).

A direct connection 290A, 290B may be provided, as shown for example between the electrical rafts of the assemblies 600B and 600C in the FIG. 8 arrangement. Such a direct connection 290A, 290B may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600G.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical rafts 200 and/or electrical raft assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical rafts 200 and/or electrical raft assemblies 600 and gas turbine engines 10 comprising electrical rafts 200 and/or electrical raft assemblies 600 other than those described herein may fall within the scope of the invention. For example, alternative arrangements of electrical rafts 200 (for example in terms of the arrangement, including number/shape/positioning/constructions, of mounting fixtures, the arrangement/shape/positioning/construction of the electrical rafts 200, the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and/or raft assemblies and between the electrical (or non-electrical) rafts or raft assemblies and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A gas turbine engine having an electrical raft, the electrical raft comprising:
   components embedded in a rigid material, the components including embedded electrical conductors that form at least a part of an electrical system of the gas turbine engine, the electrical conductors configured to carry electrical signals for the gas turbine engine; and
   a raft map comprising lines indicating paths of at least some of the embedded electrical conductors within the electrical raft, the raft map being visible from outside the electrical raft, wherein the electrical raft has at least one outer surface, on which the raft map is provided.

2. The gas turbine engine according to claim 1, wherein the rigid material is a rigid composite material.

3. The gas turbine engine according to claim 1, wherein:
   the embedded components further comprise at least one fluid passage embedded in the rigid material; and
   the raft map also comprises a further line that shows a path of the or each embedded fluid passage.

4. The gas turbine engine according to claim 3, wherein the raft map also includes an arrow indicating a direction in which fluid is configured to flow through the fluid passage in use.

5. The gas turbine engine according to claim 3, wherein:
   the raft map comprises an active indicator that has at least two state outputs, each state output indicating a different state of the fluid passage in use.

6. The gas turbine engine according to claim 1, wherein:
   the raft map comprises an active indicator that has at least two state outputs, each state output indicating a different state of an electrical component.

7. The gas turbine engine according to claim 5, wherein the active indicator comprises a light emitting device.

8. The gas turbine engine according to claim 1 wherein:
   the raft map shows a projection of an actual position of at least some of the embedded components.

9. The gas turbine engine according to claim 1, wherein the raft map is a substantially full scale representation of the embedded components.

10. The gas turbine engine of claim 1, wherein the electrical raft forms a first engine installation component; and
    a second engine installation component comprising electrical conductors; and
    at least one flexible cable electrically connected between the electrical raft and the second engine installation component.

11. The gas turbine engine according to claim 5, wherein the state indicated by the active indicator corresponds to at least one of a flow rate and a flow pressure through the fluid passage in use.

12. The gas turbine engine according to claim 6, wherein the state indicated by the active indicator corresponds to at least one of a voltage across and a current through an electrical component in use.

13. The gas turbine engine according to claim 8, wherein the projection is a projection onto a surface of the electrical raft.

14. A method of servicing a gas turbine engine according to claim 1, the method comprising:
    removing the electrical raft from the gas turbine engine; and
    installing a second, pre-prepared, electrical raft onto the gas turbine engine in place of the removed electrical raft.

* * * * *